United States Patent
Mauder et al.

(10) Patent No.: US 7,777,274 B2
(45) Date of Patent: Aug. 17, 2010

(54) POWER SEMICONDUCTOR COMPONENT HAVING A FIELD ELECTRODE AND METHOD FOR PRODUCING THIS COMPONENT

(75) Inventors: Anton Mauder, Kolbermoor (DE); Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 153 days.

(21) Appl. No.: 11/521,075

(22) Filed: Sep. 14, 2006

(65) Prior Publication Data

US 2007/0069257 A1    Mar. 29, 2007

(30) Foreign Application Priority Data

Sep. 14, 2005   (DE) .................. 10 2005 043 916

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. .................. 257/341; 257/328; 257/334; 257/492; 257/E29.013; 257/E21.384; 438/268; 438/212

(58) Field of Classification Search .............. 257/341, 257/328, 334, 492, 493, 330, E29.013, E21.384; 438/268, 212, 259

See application file for complete search history.

(56) References Cited

U.S. PATENT DOCUMENTS

| 4,903,189 | A |   | 2/1990  | Ngo et al. |
| 4,914,058 | A | * | 4/1990  | Blanchard ............... 438/270 |
| 4,941,026 | A |   | 7/1990  | Temple |
| 6,555,873 | B2 |  | 4/2003  | Disney et al. |
| 6,717,230 | B2 |  | 4/2004  | Kocon |
| 6,764,966 | B1 | * | 7/2004  | En et al. ................. 438/785 |
| 6,853,033 | B2 |  | 2/2005  | Liang et al. |
| 2004/0159884 | A1 | * | 8/2004 | Matsuoka ............... 257/327 |
| 2005/0269644 | A1 | * | 12/2005 | Brask et al. ............ 257/369 |

* cited by examiner

*Primary Examiner*—Cuong Q Nguyen
*Assistant Examiner*—Cathy N Lam
(74) *Attorney, Agent, or Firm*—Maginot, Moore & Beck

(57) ABSTRACT

A power semiconductor component includes a semiconductor body and a field electrode. The semiconductor body has a drift zone of a first conduction type and a further component defining a junction therebetween. The junction is configured to cause a space charge zone to propagate when a reverse voltage is applied to the junction. The field electrode is arranged adjacent to the drift zone, and is insulated from the semiconductor body by at least a dielectric layer. The dielectric layer has a first section and a second section, the first section arranged nearer to the junction and having a higher dielectric constant than the second section.

19 Claims, 7 Drawing Sheets

FIG 1

PRIOR ART

POWER SEMICONDUCTOR COMPONENT HAVING A FIELD ELECTRODE AND METHOD FOR PRODUCING THIS COMPONENT

FIELD OF THE INVENTION

The present invention relates to a power semiconductor component, in particular a power MOSFET, having a drift zone and a field electrode arranged adjacent to the drift zone and isolated from the drift zone by a dielectric.

BACKGROUND

Power semiconductor components, which have a drift zone and a field electrode arranged adjacent to the drift zone and isolated from the drift zone by a dielectric, are known in principle and described for example in U.S. Pat. No. 4,903,189 (Ngo), U.S. Pat. No. 4,941,026 (Temple), U.S. Pat. No. 6,555,873 B2 (Disney), U.S. Pat. No. 6,717,230 B2 (Kocon), U.S. Pat. No. 6,853,033 B2 (Liang).

The provision of a field electrode which is insulated from the drift zone and which is at the potential of the source terminal in the case of a MOSFET, for example, enables a higher doping of the drift zone and thus leads to a reduction of the "on" resistance of the component for the same dielectric strength. In the case of these components, the field electrode provides an opposite charge with respect to the charge that is present in the drift zone and results from the doping. Charge carriers in the drift zone are compensated for by this opposite charge, so that the dielectric strength of the component is not reduced despite higher doping of the drift zone.

In order to afford a better understanding of the invention explained below, the basic principle of such a component will be explained first with reference to a power MOSFET illustrated in FIG. 1.

Figure 1:
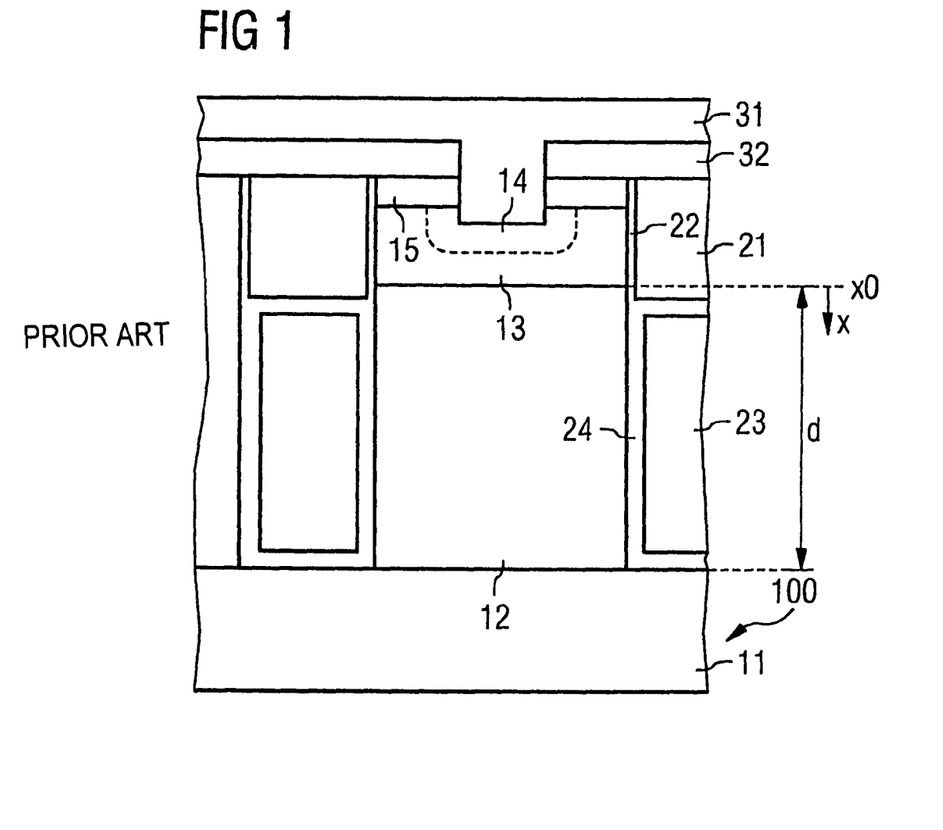
FIG. 1 shows a power semiconductor component formed as a trench MOSFET according to the prior art, said component having a field electrode arranged adjacent to a drift zone in a trench.

The MOSFET of FIG. 1 has a drift zone 12 arranged in a semiconductor body 100, said drift zone being arranged between a drain zone 11 and a body zone 13 in a vertical direction of the semiconductor body 100. A field electrode 23, sometimes in the form of a field plate, is arranged adjacent to the drift zone 12 in a lateral direction. The field electrode 23 is insulated from the drift zone 12 dielectrically by a dielectric layer 24 and may extend over the entire depth of the drift zone 12 in the vertical direction. At two or more sides, depending on the geometry of the drift zone, the drift zone 12 may additionally adjoin a plurality of field electrodes 23 that are at a common potential.

The body zone 13 is arranged between the drift zone 12 and a source zone 15, with which contact is made by a source electrode 31. In this case, the body zone 13 is formed complementarily with respect to the source zone 15, the drift zone 12 and the drain zone 11 and is p-doped in the case of an n-conducting MOSFET and n-doped in the case of a p-conducting MOSFET. The drift zone 12 is doped more weakly than the source zone 15 and the drain zone 11.

In order to form an electrically conductive channel in the body zone 13 between the source zone 15 and the drift zone 12, a gate electrode 21 is present, which is arranged adjacent to the body zone 13 and is insulated from the body zone 13 dielectrically by a gate dielectric 22. In this case, the gate electrode 21 and the field electrode 23 may be arranged in a manner lying one above the other in the vertical direction in a common trench of the semiconductor body 100.

The explanations below relate to an n-conducting MOSFET having n-doped drain, drift and source zones 11, 12, 15 and a p-doped body zone 13. Such a MOSFET turns on when a positive voltage is applied between the drain zone 11 and the source zone 15 if a suitable positive driving potential is present at the gate electrode 21. The component turns off in the case of a positive drain-source voltage in the absence of a suitable driving potential at the gate electrode 21 for forming a conductive channel in the body zone 13. The pn junction between the body zone 13 and the drift zone 12 is reverse-biased in this case. Proceeding from said pn junction, a space charge zone propagates in the drift zone 12 in the direction of the drain zone 11. The extent of said space charge zone, which is also referred to as depletion zone, is dependent on the reverse voltage present. Within the space charge zone, positively charged donor cores are present in the drift zone 12 and, in the absence of a field electrode, they find their opposite charge in the form of acceptors, to which an electron is bonded, exclusively in the body zone 13. The formation of said space charge zone leads to an electric field which has its maximum field strength in the region of the pn junction and the field strength of which decreases in the drift zone 12 in the direction of the drain zone 11. In this case, the field strength may rise maximally up to a critical field strength dependent on the respective semiconductor material before an avalanche breakdown occurs. Said critical field strength $E_{krit}$ is, in the case of silicon, for example, approximately $E_{krit}$=400 kV/cm for a doping concentration of $10^{16}$ dopant atoms/cm³. In this case, the maximum field strength of the electric field increases, for the same reverse voltage present, with the number of positively charged donor cores which find their opposite charge in the body zone 13.

The functional principle of the MOSFET having a field plate 23 as illustrated in FIG. 1 is based, then, on making available opposite charges for positively charged donor cores of the drift zone 12 in the field electrode 23 adjoining the drift zone 12 in the lateral direction. As a result, this has the effect that the space charge zone can propagate further for a given doping level in the vertical direction of the drift zone before the critical field strength is reached, which ultimately leads to an increase in the breakdown voltage. This is equivalent to being able to implement a higher basic doping of the drift zone 12 for a predetermined breakdown voltage, which in turn leads to a reduction of the on resistance of the component.

The proportion of positively charged donor cores in the drift zone 12 which can be compensated for by means of the field electrodes is limited by the so-called breakdown charge $Q_{BR}$ of the semiconductor material used, for which the following holds true:

$$Q_{BR} \in \epsilon_0 \cdot \epsilon_r \cdot E_{krit}/q \tag{1}$$

Said breakdown charge is dependent only on the dielectric constant of the semiconductor material used and the elementary charge q. A breakdown charge of $2.6 \cdot 10^{12}/\text{cm}^2$ results for the value of the abovementioned critical field strength $E_{krit}$=400 kV/cm of silicon. For lower doping concentrations, this value of the breakdown charge decreases depending on the critical field strength that is lower in these cases in accordance with $$E_{krit} = 4.01 \text{ kV/cm} \cdot (N_D \cdot \text{cm}^3)^{1/8} \tag{2}$$

wherein $N_D$ denotes the doping concentration.

The breakdown charge specifies how many positively charged donor cores per unit area are permitted to be present which find an opposite charge in one direction before an avalanche breakdown of the semiconductor material used occurs.

The compensation of charge carriers in the drift zone 12 by means of the field electrode 23 presupposes a capacitive coupling between the drift zone 12 and the field electrode 23 by means of the dielectric layer 24 and also a voltage difference between the drift zone 12 and the field electrode 23. What is problematic in this case is that a maximum compensation effect occurs only in those regions of the drift zone 12 which are at a distance from the pn junction in a vertical direction since it is only in these regions that there is a sufficiently high voltage drop between the drift zone 12 and the field electrode 23 to compensate for a charge corresponding to the breakdown charge in the drift zone 12. The capacitance—referred to hereinafter as "coupling capacitance"—between the field electrode 23 and the drift zone 12 could be increased by reducing the thickness of the dielectric layer 24. However, this would make the dielectric layer sensitive to voltage spikes that can occur during operation of a power semiconductor component.

Figure 2:
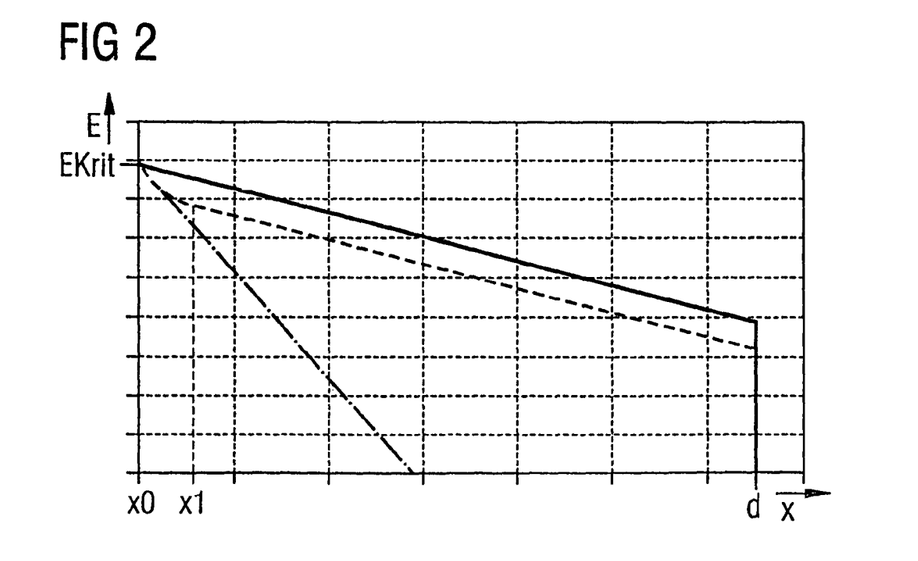
FIG. 2 shows profiles of the electric field strength in the drift zone of a MOS transistor according to the prior art without a field electrode (dash-dotted curve), with a field electrode (dashed curve), and of a MOS transistor according to the invention with a field electrode (solid curve).

FIG. 2 illustrates as a dashed line the profile of the electric field in the drift zone 12 in the vertical direction proceeding from the pn junction, assuming that a reverse voltage is present at which the electric field strength in the region of the pn junction lies just below the value of the critical field strength $E_{krit}$. Proceeding from the pn junction, the position of which corresponds to point x0 of the system of coordinates in FIG. 2, the field strength initially decreases rapidly in the direction of the drain zone 11. The reason for this is that in the region adjoining the pn junction there is not yet a compensation effect by means of the field electrodes 23, so that positively charged donor cores find their opposite charge exclusively in the body zone 13. The profile of the electric field strength E flattens out starting from a position x1, from which a voltage drop between the drift zone 12 and the field electrode 23 is high enough to compensate for a charge corresponding to the breakdown charge. Starting from a point x2 indicating the junction between the weakly doped drift zone 12 and the highly doped drain zone 11, the electric field decreases rapidly to zero owing to the high doping concentration in the drain zone 11.

FIG. 2 illustrates as a dash-dotted line the profile of the electric field strength that would result without a field electrode 23.

The breakdown voltage of the component corresponds to the integral of the electric field strength over the length d of the drift zone. As can be seen, the compensation by the field electrodes 23 leads to a significant gain in breakdown voltage given the same doping of the drift zone 12. The breakdown voltage does not reach its maximum value, however, on account of the lack of compensation of the charge carriers in the region adjoining the pn junction.

SUMMARY

At least some embodiments of the present invention improve the breakdown voltage capabilities in a semiconductor component having a drift zone and a field electrode arranged adjacent to the drift zone via improved compensation of charge carriers in the drift zone by means of the field electrode.

A first embodiment of the invention is a power semiconductor component that includes a semiconductor body and a field electrode. The semiconductor body has a drift zone of a first conduction type and a further component zone defining a junction therebetween. The junction is configured to cause a space charge zone to propagate when a reverse voltage is applied to the junction. The field electrode is arranged adjacent to the drift zone, and is insulated from the semiconductor body by at least a dielectric layer. The dielectric layer has a first section and a second section, the first section arranged nearer to the junction and having a higher dielectric constant than the second section.

The component according to the above embodiment may be formed as a MOS transistor, for example. The pn junction in this case forms the junction between the body zone and the drift zone of the component. The component according to the above embodiment may also be formed as a Schottky diode. In this case, the junction is a Schottky contact between an anodally arranged Schottky metal or an anode electrode and the drift zone.

The present invention is explained in more detail below on the basis of exemplary embodiments.

DETAILED DESCRIPTION

In the figures, unless specified otherwise, identical reference symbols designate identical component regions with the same meaning.

The power semiconductor component according to one embodiment of the invention has a semiconductor body having a drift zone of a first conduction type and a junction between the drift zone and a further component zone, said further component zone being configured in such a way that when a reverse voltage is applied to the junction, a space charge zone forms in a first direction in the drift zone. The component additionally has a field electrode, which is arranged adjacent to the drift zone in a second direction and which is arranged in a manner insulated from the semiconductor body by means of a dielectric layer. In this case, the dielectric layer has a first section and a second section, the first section of which is arranged nearer to the junction in the first direction and has a higher dielectric constant than the second section.

The dielectric constant of the first section of the dielectric layer has the effect that in a region near the junction even in the case of small voltages between the field electrode and the drift zone a sufficiently high coupling capacitance is present to compensate for charge carriers in the drift zone.

The dielectric layer is preferably thicker in the second direction, that is to say in the direction of the drift zone, in the second section than in the first section. Together with the lower dielectric constant of the dielectric layer in the second section, this has the effect that the coupling capacitance is lower in the region of the second section arranged further away from the junction. Sufficient compensation in said second section is nevertheless ensured here, since, with the component in the off state, a voltage drop between the drift zone and the field electrode increases in the direction of the drain zone, so that a higher voltage difference between the drift zone and the field electrode is present in the second section of the dielectric layer.

The junction proceeding from which a space charge zone propagates in the drift zone when a reverse voltage is applied is, by way of example, a pn junction or a Schottky junction or a Schottky contact.

Figure 3:
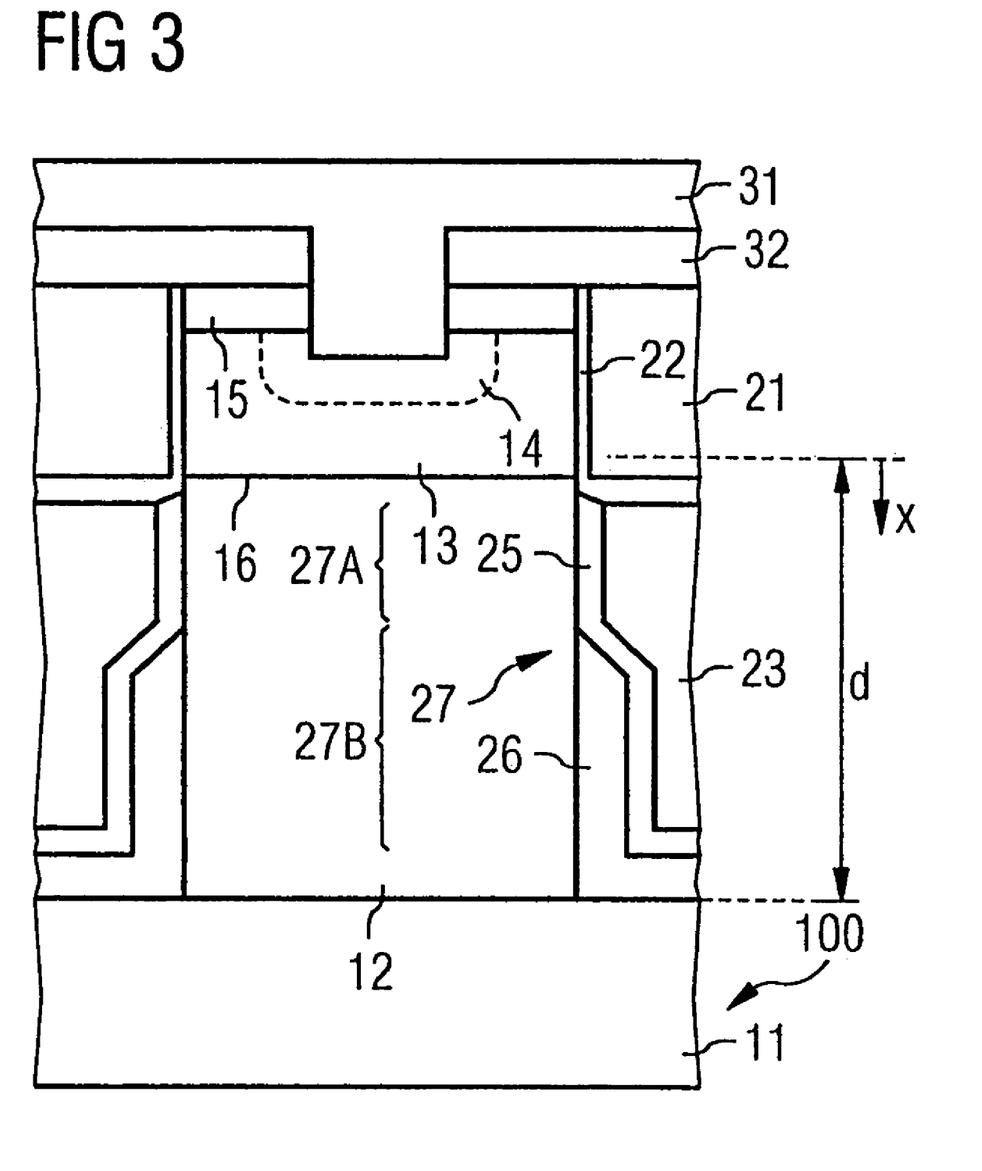
FIG. 3 shows in side view in cross section a power semiconductor component according to the invention formed as a MOS transistor, said component having a field electrode isolated from a drift zone by a dielectric layer having different relative permittivities in sections.

FIG. 3 shows in side view in cross section a semiconductor component according to the invention formed as a trench MOS transistor, having a field electrode 23 arranged adjacent to a drift zone 12 and insulated from drift zone 12 dielectrically by a dielectric layer 27. The drift zone 12 is arranged in a semiconductor body 100, in which a body zone 13 doped complementarily with respect to the drift zone 12 adjoins the drift zone 12 in a first direction, which is referred to hereinafter as the vertical direction. A pn junction, designated by the reference symbol 16 in FIG. 3, is formed between the body zone 13 and the drift zone 12. A gate electrode 21 is arranged adjacent to the body zone 13 and is insulated from the body zone 13 dielectrically by means of a gate dielectric 22.

In the case of the component illustrated, the field electrode 23 and the gate electrode 21 are arranged in a manner lying one above the other in the vertical direction of the semiconductor body 100 in a common trench. It should be pointed out in this connection that this is not absolutely necessary for proper functioning of the component. Thus, the gate electrode 21 and the field electrode 23 could also be arranged in separate trenches of the semiconductor body 100.

A source zone 15 doped complementarily with respect to the body zone 13 is present in a manner adjoining the body zone 13 or embedded in the body zone 13, and a source electrode 31 makes contact with said source zone 15 together with the body zone 13. Said source electrode 31 is insulated from the gate electrode 21 by means of an insulation layer 32. A more highly doped connection zone 14 of the same conduction type as the body zone 13 is preferably present in the body zone 13, and ensures a low-resistance contact between the source electrode 31 and the body zone 13.

A drain zone 11 adjoins an opposite side of the drift zone 12 to the body zone 13, which drain zone, in the case of a component formed as a MOSFET, is of the same conduction type as the drift zone 12 but is doped more highly than the drift zone and, in the case of a component formed as an IGBT, is doped complementarily with respect to the drift zone 12.

The invention provides for the dielectric layer 27 between the field electrode 23 and the drift zone 12 to have a first section 27A having a first dielectric constant and a second section 27B having a second dielectric constant, the first section 27A being arranged nearer to the pn junction 16 in the vertical direction than the second section 27B, and the first dielectric constant 27A being greater than the second dielectric constant 27B. The dielectric constant of the first section 27A is preferably greater than 15, and particularly preferably greater than 25.

The higher dielectric constant of the first section 27A of the dielectric layer 27 is realized by virtue of the fact that in said first section 27A a first dielectric layer 25 is arranged between the field electrode 23 and the drift zone 12, said first dielectric layer comprising a material having a high dielectric constant. Suitable materials for said first dielectric layer 25 are for example hafnium oxide ($HfO_2$) or the ferroelectric materials known from semiconductor memories, lead zirconium titanate (PZT) or barium strontium titanate (BST).

In the second section 27B, a second dielectric layer 26 is arranged between the field electrode 23 and the drift zone 12, said second dielectric layer being formed for example by a semiconductor oxide and consequently comprising silicon oxide ($SiO_2$) when silicon is used as semiconductor material. Said second dielectric layer 26 preferably has a lower dielectric constant and/or a larger thickness than the first dielectric layer 25, which means that there is a lower coupling capacitance in the lower region of the trench than in the upper region of the trench.

With regard to a facilitated production method there is the possibility of the first dielectric layer 25 covering the second dielectric layer 26 in the trench, so that said first dielectric layer 25 is arranged between the second dielectric layer 26 and the field electrode 23. This leads to a further reduction of the coupling capacitance in the lower region of the trench. This effect of a further reduction of the coupling capacitance in the lower region of the trench through the presence of the first dielectric layer 25 can be compensated for as required by means of a correspondingly reduced thickness of the second dielectric layer 26.

The second dielectric layer 26 arranged in the second section 27B is preferably formed such that it is thicker than the first dielectric layer 25 in a second direction running perpendicular to the vertical direction, said second direction being referred to hereinafter as the lateral direction.

The effects of choosing a material having a high dielectric constant for the first dielectric layer 25, which is arranged in a region of the trench near the pn junction 16, on the functioning of the component are explained below.

The following holds true for the capacitance C' per unit length of the coupling capacitance between the drift zone 12 and the field electrode 23:

$$C'=\in_0 \cdot \in_r / d_D \qquad (3).$$

In this case, $\in_0$ designates the permittivity of free space, $\in_r$ designates the dielectric constant of the dielectric used, and $d_D$ designates the thickness of the dielectric in the lateral direction.

It shall be assumed for explanation purposes that hafnium oxide is used as the material of the first dielectric layer, which has a dielectric constant $\in_r=30$, and that the thickness of the first dielectric layer is 50 nm. By applying the relationship $Q=C \cdot U$ between the charge Q stored at a capacitance C and the voltage U present across the capacitance, it can be shown that a voltage of 0.6 V already suffices to store a charge corresponding to the breakdown charge for silicon at the coupling capacitance or to compensate for said charge in the drift zone 12.

Consequently, even when there are small voltage drops, the use of a material having a high dielectric constant in the region of the pn junction leads to an appreciable compensation of charge carriers in this region. Referring to the solid curve in FIG. 2, this has the effect that for the component according to the invention the profile of the electric field strength in the vertical direction proceeding from the pn junction assumes approximately over the entire length d of the drift zone 12 a flat profile of the kind that is manifested only at a distance from the pn junction in the case of a component according to the prior art.

In this case, the area between the solid curve and the dashed curve in FIG. 2 corresponds to the difference between the dielectric strength of the component according to the prior art and the dielectric strength of the component according to the invention. The dielectric strength of the component according to the invention is thus higher for the same doping of the drift zone. This is equivalent to being able to dope the drift zone of the component according to the invention more highly than in the case of the component according to the prior art in order to achieve the same dielectric strength, or to the fact that the drift zone of the component according to the invention could be shorter in the vertical direction than the drift zone of the component according to the prior art, which likewise leads to a reduction of the on resistance.

A possible method for producing the component illustrated in FIG. 3 is explained below with reference to FIG. 4.

Figure 4A:
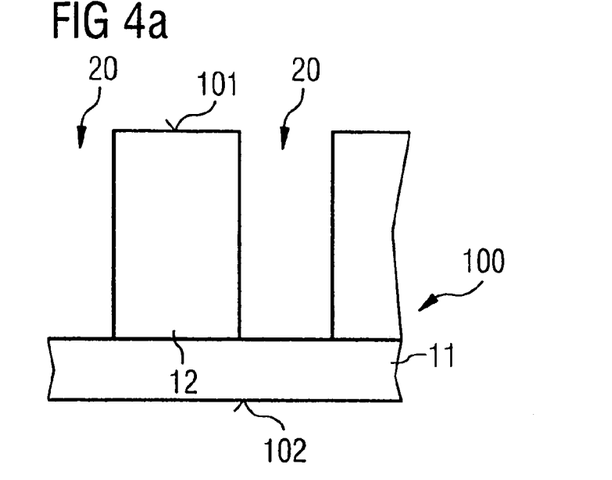
FIG. 4 illustrates method steps for producing the component in accordance with FIG. 3.

Referring to FIG. 4a, in a first method step, trenches 20 are etched into a semiconductor body 100 proceeding from one side, which is referred to hereinafter as the front side 101. This etching may be effected in a sufficiently known manner by applying a mask (not illustrated) to the front side 101 and subsequently anisotropically etching the regions of a front side 101 of the semiconductor body that are not covered by the mask. The semiconductor body 100 preferably has a highly doped first semiconductor layer, which forms the later drain zone 11 of the component, and a more weakly doped epitaxial layer 12 applied to said highly doped semiconductor layer, said epitaxial layer forming the later drift zone 12 in sections. The trenches 20 are preferably produced in such a way that the trenches at least approximately reach as far as the boundary between the highly doped layer 11 and the more weakly doped layer 12.

Figure 4B:
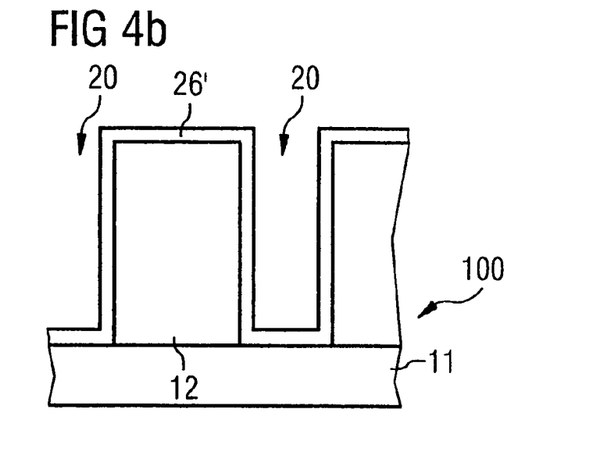

In next method steps, the result of which is illustrated in FIG. 4b, a first dielectric layer 26' is produced at least at the bottom and at the sidewalls of the trenches 20. In the example in accordance with FIG. 4b, said dielectric layer 26' is produced over the whole area on all uncovered regions of the semiconductor body 100, to be precise within and outside the trenches 20. Said dielectric layer 26' is an oxide layer, for example, which is produced by thermal oxidation of the semiconductor body 100 or by deposition of an oxide layer, for example tetraethoxysilane (TEOS).

Figure 4C:
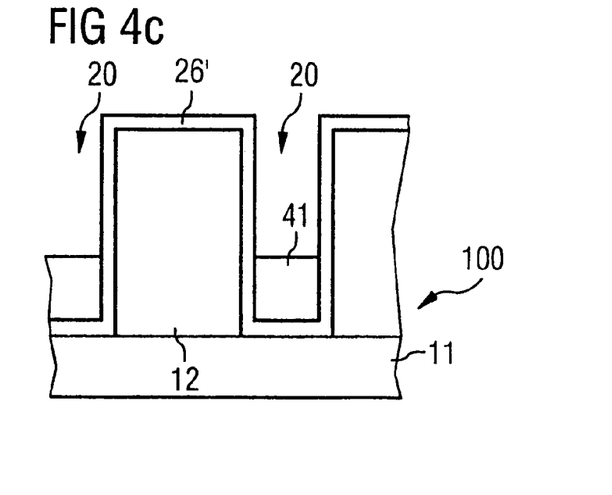
Figure 4D:
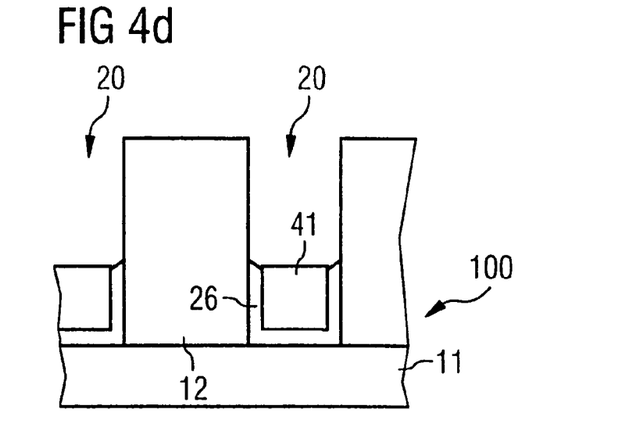

In next method steps, the result of which is illustrated in FIG. 4c, the trenches 20 are partly filled with a protective material 41, which protects the dielectric layer 26' during a subsequent etching method, the result of which is illustrated in FIG. 4d. The protective material 41 that partly fills the trenches 20 comprises a resist, by way of example. In this case, the regions with the protective material 41 are also referred to as "resist plugs". The resist plugs 41 may be produced for example by whole-area deposition of a resist layer and subsequent etching-back of the resist layer.

As an alternative to a resist, it is also possible to use other materials as protective material, such as e.g. polycrystalline silicon, which has a significantly higher thermal stability than organic materials, such as resists.

Said plugs 41 protect the dielectric layer 26' during an anisotropic etching method, the result of which is illustrated in FIG. 4d. In this case, the dielectric layer 26' is etched back to the level of an upper edge of the plugs 41 or to just below the upper edge of said plugs 41. In this case, the height of the plugs 41 defines the height of the second section of the later dielectric layer (27B in FIG. 3).

Figure 4E:
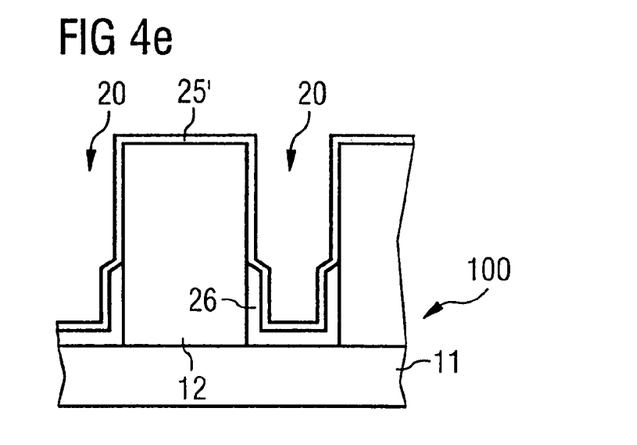

In next method steps, the result of which is illustrated in FIG. 4e, the resist plugs 41 are removed and a second dielectric layer 25' is produced at the sidewalls of the trenches 20 at least above the first dielectric layer 26 remaining after the etching-back. In the example in accordance with FIG. 4e, said second dielectric layer 25' is applied over the whole area to uncovered regions of the semiconductor body 100 and of the first dielectric layer 26.

Figure 4F:
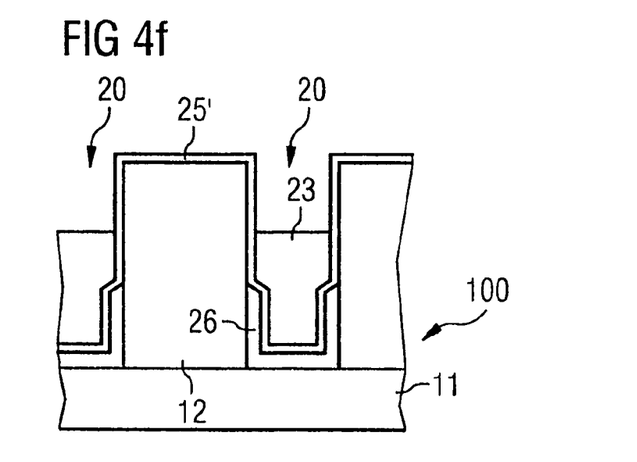

In next method steps, the result of which is illustrated in FIG. 4f, field electrodes 23 are produced in the trenches 20. Said field electrodes 23 are produced for example by whole-area deposition of an electrode layer onto the semiconductor body 100 and subsequent etching-back of the electrode layer in the trenches 20 as far as the desired height of the field electrodes 23.

Figure 4G:
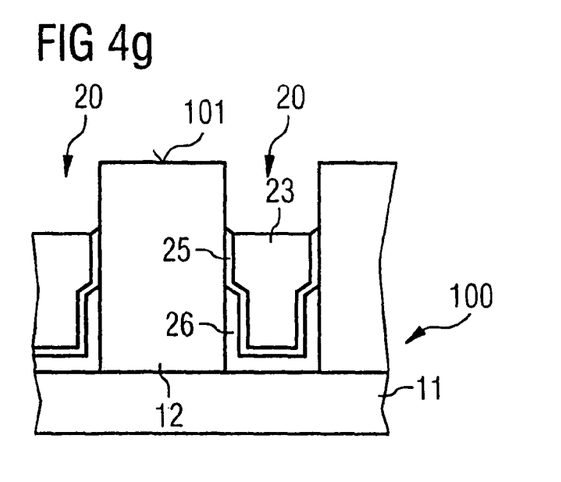

In next method steps, the result of which is illustrated in FIG. 4g, the first dielectric layer 25' is removed from the front side 101 of the semiconductor body 100 and from the sidewalls of the trenches 20 above the field electrode 23.

Figure 4H:
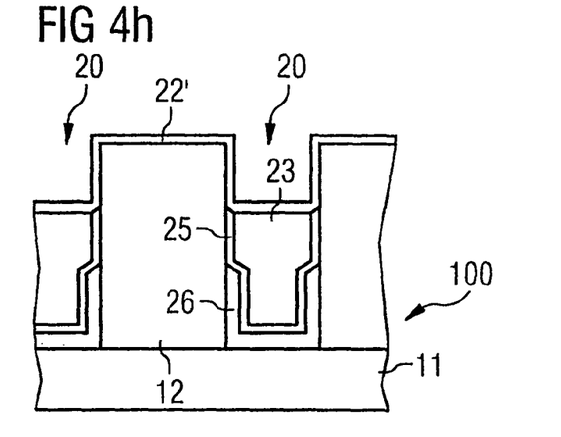

In next method steps, the result of which is illustrated in FIG. 4h, a further dielectric layer 22, which forms the later gate dielectric in sections, is produced at least on uncovered regions of the field electrode 23 and at sidewalls of the trenches 20 above the field electrodes 23. In the example in accordance with FIG. 4h, said further dielectric layer 22 is produced over the whole area, that is to say also on the front side 101, at the sidewalls of the trenches 20 and above the field electrode 23. Said dielectric layer 23', which is an oxide layer, for example, may be produced by thermal oxidation or else by deposition of an oxide.

Figure 4I:
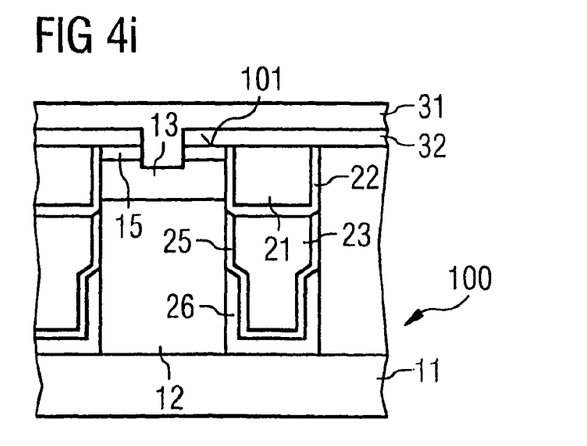

The production of said dielectric layer 22 is followed by further method steps that are known in principle for producing the gate electrode 21, the body and source zones 13, 15, the insulation layer 32 above the front side 101 of the semiconductor body 100 and the source electrode 31 making contact with the source zone and the body zone 13. The result of these method steps is illustrated in FIG. 4i. It should be pointed out in this connection that the body and source zones 13, 15 are produced for example by implantation of dopant atoms via the front side 101 and by subsequently carrying out a thermal treatment for activation and, if appropriate, for indiffusion of the implanted dopant atoms.

Figure 5A:
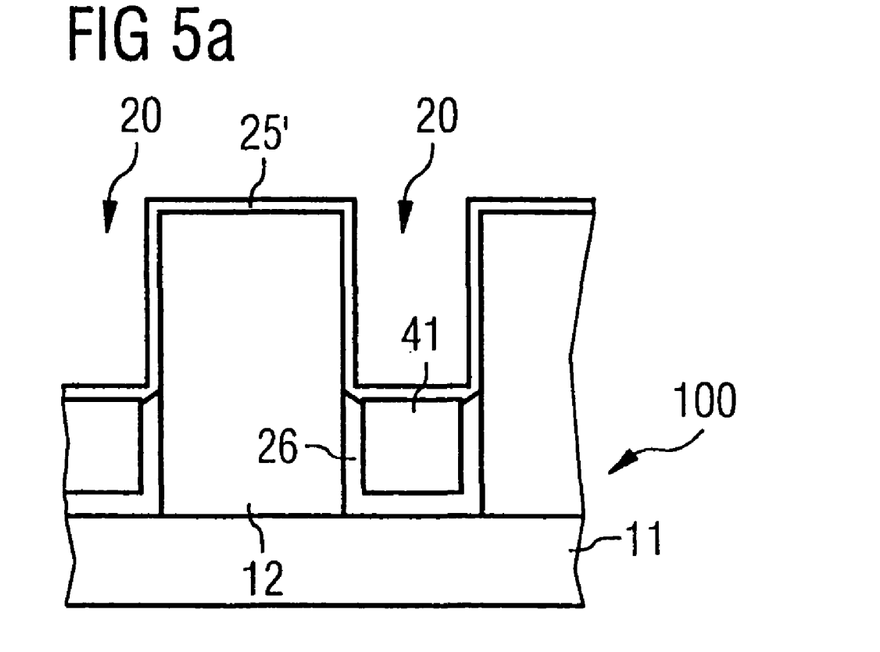
FIG. 5 illustrates in sections an alternative to the production method explained with reference to FIG. 4.
Figure 5B:
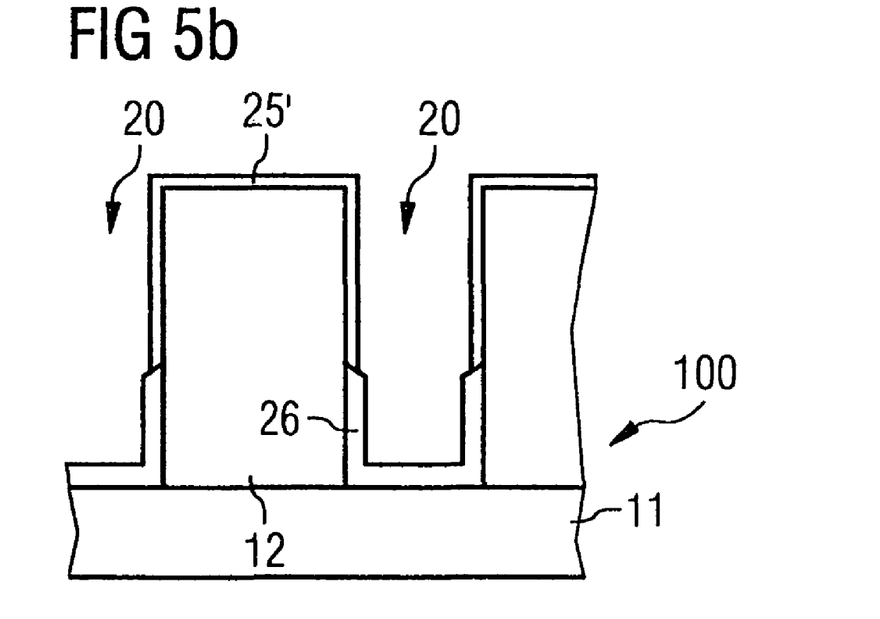

In accordance with an alternative to the previously explained method which is illustrated in FIGS. 5a and 5b, there is also the possibility of initially leaving the plugs 41 after the method step explained in FIG. 4d and then depositing the second dielectric layer 25'. The result of this is illustrated in FIG. 5a.

The second dielectric layer 25', which in this case covers the sidewalls of the trench and the top side of the plugs 41, is subsequently removed anisotropically above the resist plugs 41 and thus also from the front side of the semiconductor body. It is only after this that the plugs 41 are removed and the further method steps for producing the field electrode 23 and the gate electrode 21 as explained with reference to FIGS. 4f to 4i are carried out.

This method alternative ultimately has the effect that only the second dielectric layer is present in the upper section of the trenches and only the first dielectric layer is present in the lower section of the trenches. The plugs 41 used for carrying out this method are preferably plugs made of polysilicon, which—in contrast to resist plugs—withstand the high temperatures required for the deposition of the second dielectric layer 25'.

The principle according to the invention of providing, in the region of a junction between a drift zone and a further component zone, a dielectric having a high dielectric constant between the drift zone and a field electrode is not restricted to MOS transistors, but rather can also be applied to further power semiconductor components, in particular unipolar power semiconductor components.

Figure 6:
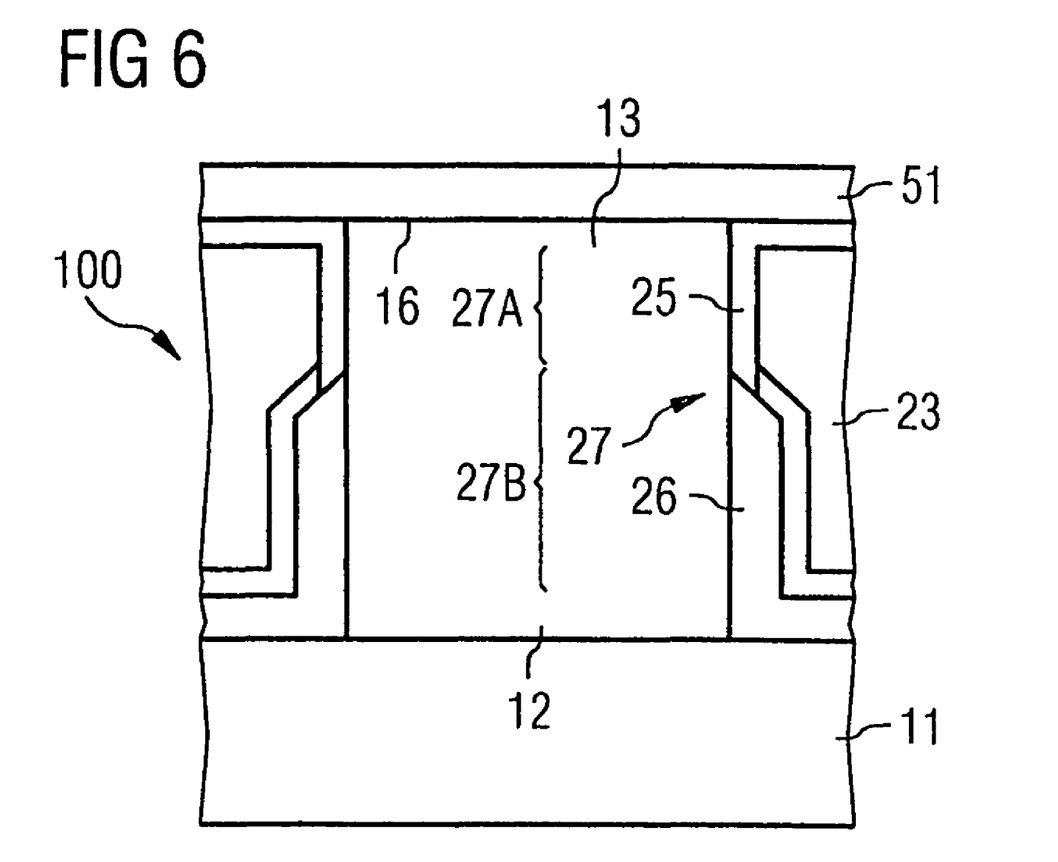
FIG. 6 shows in side view in cross section a power semiconductor component according to the invention formed as a Schottky diode.

FIG. 6 shows in side view in cross section a power semiconductor component according to the invention formed as a Schottky diode. The component has a drift zone 12 arranged in a semiconductor body 100, said drift zone being adjoined in a vertical direction by a connection zone 11 doped more highly than the drift zone 12, said connection zone forming a cathode zone. The drift zone 12 and the connection zone 11 are n-doped, by way of example.

At a side of the drift zone 12 that is removed from the connection zone 11, there is a Schottky junction 16 between the drift zone 12 and a Schottky metal 51, which forms a connection electrode of the component. The Schottky diode illustrated is reverse-biased when a positive voltage is applied between the connection zone 11 and the Schottky metal, so that a space charge zone propagates in the drift zone in the vertical direction proceeding from the Schottky junction.

A field electrode 23 is arranged in a trench extending into the semiconductor body 100 in the vertical direction, and is insulated from the drift zone 12 dielectrically by a dielectric layer 27. In this case, in a first section 27A, which is arranged nearer to the Schottky junction than a second section 27B, the dielectric layer 27 has a higher dielectric constant than the dielectric layer 27 in the second section 27B. The first section 27A has a first dielectric layer 25 having a higher dielectric constant than a second dielectric layer 26 arranged in the second section 27B. The explanations given above in connection with the component in accordance with FIG. 3 with regard to the field electrode 23, the dielectric layer 27 and the drift zone 12 correspondingly hold true for the component in FIG. 5.

The field electrode 23 may be coupled, in a manner not specifically illustrated, to a connection or a component zone for an arbitrary fixed or variable electrical potential of the component, to be precise optionally by means of an electrically conductive connection or by means of a capacitive coupling.

The field electrode is preferably coupled to the front-side load electrode, that is to say the source electrode 31 in the case of a MOSFET or the Schottky metal 51 in the case of a Schottky diode. Furthermore, the field electrode 23 may also be coupled to the gate electrode 21 or to a potential tap of a capacitive or resistive voltage divider present between the source electrode 31 and the drain electrode 11 or respectively the Schottky metal 51 and the second electrode 11 of the Schottky diode.

Furthermore, there is also the possibility of arranging the field electrode 23 in floating fashion, that is to say not at a predetermined potential.

What is claimed is:

1. A power semiconductor component comprising:
    a semiconductor body having a drift zone of a first conduction type,
    a junction between the drift zone and a further component zone, the junction configured to cause a space charge zone to propagate in a first direction when a reverse voltage is applied to the junction,
    a field electrode arranged adjacent to the drift zone in a second direction, the field electrode insulated from the semiconductor body by at least a dielectric layer,
    the dielectric layer having a first section and a second section, the first section arranged nearer to the junction; and
    wherein the dielectric layer has a first dielectric layer and a second dielectric layer, the first section including the first dielectric layer which is arranged between the field electrode and the drift zone, the second section including the first dielectric layer and the second dielectric layer which are each arranged between the field electrode and the drift zone,
    wherein the first dielectric layer has a higher dielectric constant than the second dielectric layer.

2. The power semiconductor component as claimed in claim 1, wherein the second section of the dielectric layer is, with respect to the second direction, thicker than the first section.

3. The power semiconductor component as claimed in claim 1, wherein the dielectric constant of the first section is at least about 15.

4. The power semiconductor component as claimed in claim 1, wherein the further component zone comprises a body zone of a MOSFET, the body zone doped complementarily with respect to the drift zone.

5. The power semiconductor component as claimed in claim 4, further comprising:
    a drain zone adjoining the drift zone at a side remote from the body zone,
    a source zone arranged in a manner separated from the drift zone by the body zone,
    a gate electrode arranged adjacent to the body zone and insulated from the body zone by a dielectric.

6. The power semiconductor component as claimed in claim 5, wherein the gate electrode is adjacent to, but insulated from, the field electrode in a common trench.

7. The power semiconductor component as claimed in claim 1, wherein the further component zone comprises a Schottky metal zone, and further comprises a cathode zone adjoining the drift zone at a side remote from the Schottky metal zone.

8. The power semiconductor component as claimed in claim 1, wherein the field electrode is coupled to a potential of a component zone.

9. The power semiconductor component as claimed in claim 8, wherein the component zone is the further component zone.

10. The power semiconductor component as claimed in claim 1, wherein the power semiconductor component forms a MOSFET and the field electrode is coupled to a variable potential present between a drain zone and a source zone of the MOSFET.

11. The power semiconductor component as claimed in claim 10, in which the field electrode is coupled to a tap of a voltage divider present between the drain zone and the source zone.

12. A method for producing a field electrode insulated from a semiconductor body by a dielectric layer, the field electrode forming part of a power semiconductor component, the method comprising:
    providing a semiconductor body having a first and a second side,
    producing at least one trench which extends into the semiconductor body proceeding from the first side, the trench having sidewalls and a bottom,
    producing a first dielectric layer at the bottom and at the sidewalls of the trench in a lower region located at a distance from the first side,
    producing a second dielectric layer having a higher dielectric constant than the first dielectric layer on the first dielectric layer and at the sidewalls of the trench, such that at least sections of the second dielectric layer are disposed in a section of the trench that is located in the direction toward the first side
    wherein the dielectric layer has a first section and a second section, the first section being arranged nearer to the first side,
    wherein the dielectric layer has the first dielectric layer and the second dielectric layer,
    wherein the first section includes the second dielectric layer which is arranged between the field electrode and the drift zone, and the second section includes the first dielectric layer and the second dielectric layer which are each arranged between the field electrode and the drift zone, and filling the trench in the regions covered by the second dielectric layer with an electrode material in order to produce the field electrode.

13. A power semiconductor component comprising:

a semiconductor body having a drift zone of a first conduction type and a further component zone defining a junction therebetween, the junction configured to cause a space charge zone to propagate at least within the drift zone when a reverse voltage is applied to the junction, and a field electrode arranged adjacent to the drift zone, the field electrode insulated from the semiconductor body by at least a dielectric layer, the dielectric layer having a first section and a second section, the first section arranged nearer to the junction;

wherein the dielectric layer has a first dielectric layer and a second dielectric layer, the first section including the first dielectric layer which is arranged between the field electrode and the drift zone, the second section including the first dielectric layer and the second dielectric layer which are each arranged between the field electrode and the drift zone, and wherein the first dielectric layer has a higher dielectric constant than the second dielectric layer.

14. The power semiconductor component as claimed in claim 13, wherein the second section of the dielectric layer is thicker than the first section.

15. The power semiconductor component as claimed in claim 13, wherein the dielectric constant of the first section is at least about 14.

16. The power semiconductor component as claimed in claim 13, wherein the further component zone comprises a body zone of a MOSFET, the body zone doped complementarily with respect to the drift zone.

17. The power semiconductor component as claimed in claim 16, further comprising:

a drain zone adjoining the drift zone at a side remote from the body zone, a source zone arranged in a manner separated from the drift zone by the body zone, a gate electrode arranged adjacent to the body zone and insulated from the body zone by a dielectric.

18. The power semiconductor component as claimed in claim 17, wherein the gate electrode is adjacent to, but insulated from, the field electrode in a common trench.

19. A power semiconductor component comprising:

a semiconductor body having a drift zone of a first conduction type;

a junction between the drift zone and a further component zone, the junction configured to cause a space charge zone to propagate in a first direction when a reverse voltage is applied to the junction;

a field electrode arranged adjacent to the drift zone in a second direction, the field electrode insulated from the semiconductor body by at least a dielectric layer, the dielectric layer having a first section and a second section, the first section arranged nearer to the junction;

wherein the dielectric layer has a first dielectric layer and a second dielectric layer, the first section including the first dielectric layer which is arranged between the field electrode and the drift zone, the second section including the first dielectric layer and the second dielectric layer which are each arranged between the field electrode and the drift zone, and wherein the first dielectric layer has a higher dielectric constant than the second dielectric layer;

a drain zone adjoining the drift zone at a side remote from the further component zone;

a source zone arranged in a manner separated from the drift zone by the further component; and a gate electrode arranged adjacent to the further component and insulated from the further component by a dielectric.

* * * * *